United States Patent
Li et al.

(10) Patent No.: US 6,656,842 B2
(45) Date of Patent: *Dec. 2, 2003

(54) BARRIER LAYER BUFFING AFTER CU CMP

(75) Inventors: Shijian Li, San Jose, CA (US); Fred C. Redeker, Fremont, CA (US); Ramin Emami, San Jose, CA (US); Sen-Hou Ko, Cupertino, CA (US); John M. White, Hayward, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 77 days.

(21) Appl. No.: 09/401,643

(22) Filed: Sep. 22, 1999

(65) Prior Publication Data

US 2001/0055880 A1 Dec. 27, 2001

(51) Int. Cl.$^7$ .............................................. H01L 21/302
(52) U.S. Cl. ..................... 438/691; 438/692; 438/693; 438/697; 451/57
(58) Field of Search ................................ 438/691, 692, 438/693, 697; 252/79.1; 216/38, 103, 105; 451/57, 59

(56) References Cited

U.S. PATENT DOCUMENTS

| 5,014,468 A | | 5/1991 | Ravipati et al. |
| 5,453,312 A | | 9/1995 | Haas et al. |
| 5,454,844 A | | 10/1995 | Hibbard et al. |
| 5,676,587 A | * | 10/1997 | Landers et al. ................ 451/57 |
| 5,692,950 A | | 12/1997 | Rutherford et al. |
| 5,693,563 A | | 12/1997 | Teong |
| 5,770,095 A | * | 6/1998 | Sasaki et al. .................. 216/38 |
| 5,820,450 A | | 10/1998 | Calhoun |
| 5,842,910 A | | 12/1998 | Krywanczyk et al. |
| 5,893,796 A | | 4/1999 | Birang et al. |
| 6,001,730 A | * | 12/1999 | Farkas et al. ................ 438/627 |
| 6,074,949 A | * | 6/2000 | Schonauer et al. ......... 438/692 |
| 6,083,840 A | * | 7/2000 | Mravic et al. .............. 438/693 |
| 6,117,775 A | * | 9/2000 | Kondo et al. ................ 438/690 |

FOREIGN PATENT DOCUMENTS

| EP | 1 006 166 A1 | 6/2000 | ............. C09G/1/02 |
| EP | 1 011 131 A1 | 6/2000 | ......... H01L/21/321 |
| EP | 1 085 067 A1 | 3/2001 | ............. C09G/1/02 |
| WO | WO 00/24842 | 5/2000 | ............. C09K/3/14 |

OTHER PUBLICATIONS

US 5,985,755, 11/1999, Bajaj et al. (withdrawn)
PCT International Search Report dated Sep. 23, 2002.

* cited by examiner

Primary Examiner—Robert Kunemund
Assistant Examiner—Lan Vinh
(74) Attorney, Agent, or Firm—Moser, Patterson & Sheridan

(57) ABSTRACT

Deposited Cu is initially removed by CMP with fixed abrasive polishing pads stopping on the barrier layer, e.g., Ta or TaN. Buffing is then conducted selectively with respect to Cu: Ta or TaN and Cu: silicon oxide to remove the barrier layer and control dishing to no greater than 100 Å.

16 Claims, 2 Drawing Sheets

BARRIER LAYER BUFFING AFTER CU CMP

TECHNICAL FIELD

The present invention relates to copper (Cu) and/or Cu alloy metallization in semiconductor devices with improved planarity. The present invention is applicable to manufacturing high speed integrated circuits having submicron design features and high conductivity interconnect structures with high production through-put.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance and capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section. The entire opening is filled with a conductive material, typically a metal, to simultaneously form a conductive plug in electrical contact with a conductive line.

Cu and Cu alloys have received considerable attention as a candidate for replacing Al in interconnect metallizations. Cu is relatively inexpensive, easy to process, and has a lower resistivity than Al. In addition, Cu has improved electrical properties, vis-à-vis W, making Cu a desirable metal for use as a conductive plug as well as conductive wiring.

An approach to forming Cu plugs and wiring comprises the use of damascene structures employing CMP, as in Teong, U.S. Pat. No. 5,693,563. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), titanium-titanium micride (Ti-TiN), titanium silicon nitride (TiSiN), tungsten silicon nitride (WSiN), tantalum silicon nitride (TaSiN) and silicon nitride for encapsulating Cu.

The use of such barrier materials to encapsulate Cu is not limited to the interface between Cu and the dielectric interlayer, but includes interfaces with other metals as well.

In conventional CMP techniques, a wafer carrier assembly is rotated in contact with a polishing pad in a CMP apparatus. The polishing pad is mounted on a rotating turntable or platen driven by an external driving force. The wafers are typically mounted on a rotating turntable or platen driven by an external driving force. The wafers are typically mounted on a carrier or polishing head which provides a controllable force, i.e., pressure, urging the wafers against the rotating polishing pad. Thus, the CMP apparatus effects polishing or rubbing movement between the surface of each thin semiconductor wafer and the polishing pad while dispersing a polishing slurry containing abrasive particles in a reactive solution to effect both chemical activity and mechanical activity while applying a force between the wafer and a polishing pad.

Conventional polishing pads employed in abrasive slurry processing typically comprise a grooved porous polymeric surface, such as polyurethane, and the abrasive slurry varied in accordance with the particular material undergoing CMP. Basically, the abrasive slurry is impregnated into the pores of the polymeric surface while the grooves convey the abrasive slurry to the wafer processing is disclosed by Krywanczyk et al. in U.S. Pat. No. 5,842,910. Typical CMP is performed not only on a silicon wafer itself, but on various dielectric layers, such as silicon oxide, conductive layers, such as aluminum and copper, or a layer containing both conductive and dielectric materials as in damascene processing.

A distinctly different type of abrasive article from the above-mentioned abrasive slurry-type polishing pad is a fixed abrasive article, e.g., fixed abrasive polishing pad. Such a fixed abrasive article typically comprises a backing sheet with a plurality of geometric abrasive composite elements adhered thereto. The abrasive elements typically comprise a plurality of abrasive particles in a binder, e.g., a polymeric binder. During CMP employing a fixed abrasive article, the substrate or wafer undergoing CMP wears away the fixed abrasive elements thereby exposing the abrasive particles. Accordingly, during CMP employing a fixed abrasive article, a chemical agent is dispersed to provide the chemical activity, while the mechanical activity is provided by the fixed abrasive elements and abrasive particles exposed by abrasion with the substrate undergoing CMP. Thus, such fixed abrasive articles do not require the use of a slurry containing loose abrasive particles and advantageously reduce effluent treatment and dishing as compared to polishing pads that require an abrasive slurry. During CMP employing a fixed abrasive polishing pad, a chemical agent is applied to the pad, the agent depending upon the particular material or materials undergoing CMP. However, the chemical agent does not contain abrasive particles as in abrasive slurry-type CMP operations. Fixed abrasive articles are disclosed by Rutherford et al. in U.S. Pat. No. 5,692,950, Calhoun in U.S. Pat. No. 5,820,450, Haas et al. In U.S. Pat. No. 5,453,312 and Hibbard et al. in U.S. Pat. No. 5,454,844.

Fixed abrasive elements of conventional slurry-less type polishing pads are typically formed in various "positive"

geometric configurations, such as a cylindrical, cubical, truncated cylindrical, and truncated pyramidal shapes, as disclosed by Calhoun in U.S. Pat. No. 5,820,450. Conventional fixed abrasive articles also comprise "negative" abrasive elements, such as disclosed by Ravipati et al. in U.S. Pat. No. 5,014,468.

In applying conventional planarization techniques, such as CMP, to Cu, it is extremely difficult to achieve a high degree surface uniformity, particularly across a surface extending from a dense array of Cu features, e.g., Cu lines, bordered by an open field. A dense array of metal (Cu) features is typically formed in an interlayer dielectric, such as a silicon oxide layer, by a damascene technique wherein trenches are initially formed. A barrier layer, such as a Ta-containing layer e.g., Ta, TaN, is then deposited lining the trenches and on the upper surface of the silicon oxide interlayer dielectric. Cu or a Cu alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8,000 Å to about 18,000 Å. In planarizing the wafer surface after copper metallization, erosion and dishing are typically encountered, thereby decreasing the degree of surface uniformity or planarity and challenging the depth of focus limitations of conventional photolithographic techniques, particular with respect to achieving submicron dimensions, such as below about 0.25 micron. As used throughout this disclosure, the term, "erosion" denotes the height differential between the oxide in the open field and the height of the oxide within the dense array. As also used throughout this disclosure, the term "dishing" denotes a difference in height between the oxide and Cu within the dense array.

Erosion typically occurs within the dense array and is believed to be attributed in part to an increase in pressure due to the presence of recesses and, hence, less Cu, generating a pressure differential between the dense array and the open field. Consequently, the removal rate within the dense array is greater than the removal rate in the open field. Accordingly, the barrier layer is reached within the dense array before it is reached in the open field. In fact, conventionally, the oxide layer is reached within the dense array before Cu is completely removed in the open field. Upon removing the barrier layer in the open field, the oxide layer in the dense array is over-polished resulting in erosion. Due to the high selectivity of copper: oxide and copper: tantalum, the copper lines in the dense array are overpolished, thereby resulting in dishing.

There exists a need for high production through-put Cu CMP without erosion and dishing, or with significantly reduced erosion and dishing, thereby achieving a high degree of surface planarity suitable for photolithographic techniques in forming features having dimensions within the deep submicron range.

DISCLOSURE OF THE INVENTION

An advantage of the present invention is a method of planarizing Cu and Cu alloys by CMP at high production through-put with no or significantly reduced erosion and no or significantly reduced dishing and defects.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in party by a method of planarizing a wafer surface containing: an interlayer dielectric having an upper surface and a plurality of spaced apart openings; a barrier layer lining the openings and on the upper surface of the interlayer dielectric; and copper (Cu) or a Cu alloy filling the openings and on the interlayer dielectric; the method comprising the sequential steps of: chemical mechanical polishing (CMP) the wafer to remove the Cu or Cu alloy layer stopping on the barrier layer; and buffing the wafer to remove the barrier layer at zero or reversed selectivity with respect to Cu: barrier layer and Cu: interlayer dielectric to form a dense array of Cu or Cu alloy features.

Embodiments of the present invention include forming a Cu or Cu alloy interconnection structure comprising openings in a silicon oxide interlayer dielectric lined with a barrier layer, such as a Ta-containing barrier layer, e.g., Ta or TaN, and filled with Cu or a Cu alloy. Dishing is eliminated or at least significantly reduced by buffing with zero or reversed selectivity with respect to Cu: Ta or TaN and Cu: silicon oxide.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
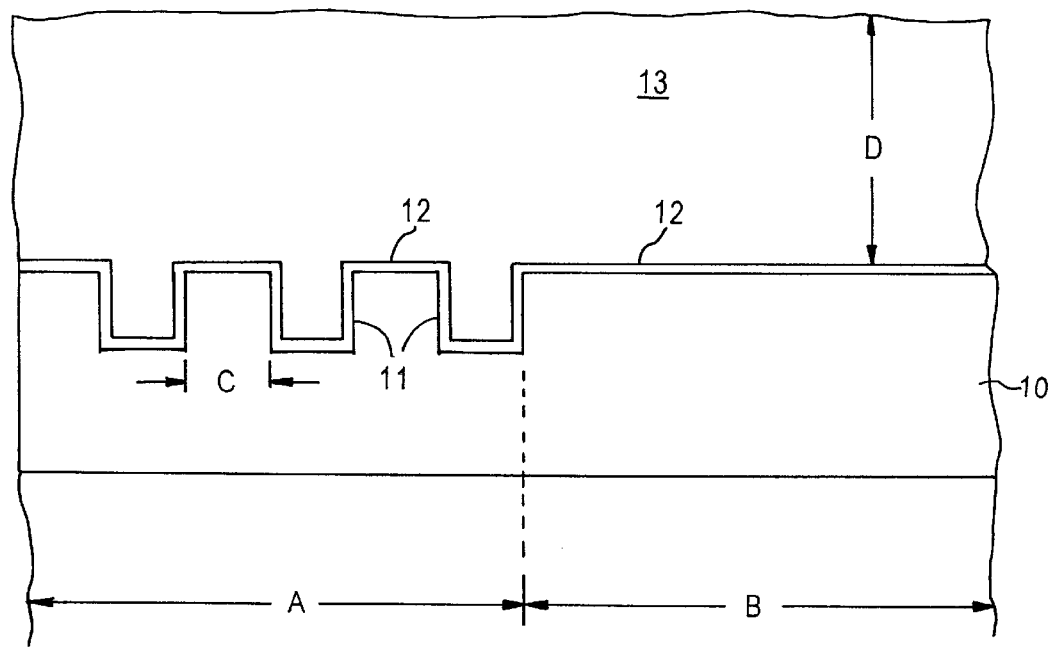
FIGS. 1–4 illustrate sequential phases of a method in accordance with an embodiment of the present invention.

The present invention achieves the heretofore elusive objective of effectively planarizing Cu metallization at high production through-put while eliminating or substantially reducing erosion, dishing and defects, consistent with the ever increasing demands for reliable interconnect patterns having feature sizes in the deep submicron range. As used throughout this disclosure, the symbol Cu is intended to encompass high purity elemental copper as well as copper-based alloys, e.g., copper-based alloys containing at least about 80 wt. % copper.

The objectives of the present invention are achieved by employing a strategic multi-step process comprising sequential CMP to relatively remove the deposited Cu stopping on the barrier layer followed by buffing with an abrasive slurry. The multi-step methodology of the present invention stems from a study of the factors impacting erosion and dishing in planarizing a dense array of Cu features, e.g., lines, bordered by an open field. The expression "dense array" is intended to encompass metal features spaced apart by a variety of distances of less than 100 microns, while the expression "open field" is intended to encompass a field extending in excess of 100 microns without a metal feature. Erosion and dishing can occur during CMP, for example, when pressure increases within the dense array due to the presence of closely spaced grooves or openings filled with Cu. Accordingly, the polishing rate within the dense array exceeds the polishing rate in the open field resulting in erosion and dishing.

Embodiments of the present invention include a multi-step process comprising: CMP employing a fixed abrasive polishing pad or a conventional non-fixed abrasive polishing pad using an abrasive or abrasive free chemical agent with high sensitivity to and stopping on the Ta or TaN barrier layer; and slurry buffing on a polishing pad at zero or reversed selectivity with respect to Cu:Ta or TaN and Cu: silicon oxide to remove the Ta or TaN barrier layer and buff the surface of the silicon oxide interlayer dielectric to reduce or eliminate scratching and defects.

CMP of the Cu film stopping on the barrier layer can be implemented in a conventional manner. It was found particularly advantageous to employ the selective multistep CMP technique disclosed in copending U.S. patent application Ser. No. 09/469,709, filed on Dec. 21, 1999, the entire disclosure of which is incorporated by reference herein. The disclosed multistep CMP technique for selectively removing Cu stopping on the Ta or TaN barrier layer comprises: Cu CMP at a first removal rate, e.g., greater than about 5,000 Å per minute, to reduce the Cu film to a thickness of about 500 Å to about 3,000 Å; and Cu CMP at a second lower removal rate, e.g., about 1,000 to about 3,000 Å per minute, stopping on the barrier layer. During CMP, dishing is controlled to no greater than about 300 Å employing various measures. CMP and buffing can be conducted with rotating or linear polishing pads or belts.

Conventional substrates and interlayer dielectrics are encompassed by the present invention. For example, the substrate can be doped monocrystalline silicon or gallium-arsenide. The interlayer dielectric can comprise any of various dielectric materials conventionally employed in the manufacture of semiconductor devices. For example, dielectric materials, such as silicon dioxide, phoso-silicate-glass (PSG), boron doped (BPSG) and silicon dioxide derviced from tetraethyl orthosilicate (TEOS) or silane by plasma enhanced chemical vapor deposition (PECVD) can be employed. Interlayer dielectrics in accordance with the present invention can also comprise low dielectric constant materials, including polymers, such as polyimides, and carbon-containing silicon dioxide, e.g., Black Diamond® available from Applied Materials, Inc., located in Santa Clara, Calif. The openings are formed in interlayer dielectrics by conventional photolithographic and etching techniques.

CMP, as by the multi-step technique disclosed in copending U.S. patent application Ser. No. 09/469,709, filed on Dec. 21, 1999, having high selectivity to the Ta or TaN barrier metal layer enables removal of excess Cu and stopping on the Ta or TaN barrier layer. The CMP end point on reaching the barrier layer can be accurately determined employing a conventional optical system, such as the layer interferometer technique disclosed in U.S. Pat. No. 5,893,796, the entire disclosure of which is incorporated herein by reference. The IRSM® system marketed by Applied Materials, Inc., of Santa Clara, Calif. can be employed for end point detection for both fixed abrasive pads and buffing, thereby significantly minimizing overpolishing.

In accordance with embodiments of the present invention, the wafer surface is buffed, employing an abrasive slurry, to remove the Ta or TaN barrier layer, under conditions such that there is zero or reversed selectivity with respect to Cu: Ta or TaN and Cu: silicon oxide. This objective can be achieved by increasing the amount of inhibitor e.g., benzotriazole, in the chemical agent to reduce copper reactivity. Buffing is typically conducted at a low pressure, e.g., no greater than about 2 psi. The polishing pad employed during buffing step can be any of those commercially available, such as an IC-1,000 or a single soft layer, e.g., a polytex pad, available from Rodel of Wilmington, Del. The optimum buffing parameters, pad composition and chemical agent can be determined in a particular situation to achieve the disclosed objective of buffing to selectively remove the Ta or TaN barrier layer and a thin portion of the underlying oxide to minimize scratching and defects. For example, buffing can be conducted at a pressure of up to about 4 psi at a rotation speed of about 40 to about 120 rpm, e.g., about 90 to 100 rpm, with a chemical agent, such as an alkaline slurry comprising about 1.0 to about 30 wt. %, e.g., about 4 wt. %, of abrasive particles, e.g., alumna ($Al_2O_3$) or silica ($SiO_2$); up to about 0.10 wt. %, e.g., about 0.01 to about 02 wt. %; of an inhibitor, e.g., benzotriazole or 5-methyl benzotriazole, and the remainder deionized water. The pH of the chemical agent is typically adjusted from about 8 to 11 using, for example, a non-chelating base such as phosphoric acid potassium hydroxide. Advantageously, a chelating agent, such as glycine, is added to the slurry, in accordance with an embodiment of the present invention, for improved planarity across the die. For example, glycine can be added to the slurry at a concentration of about 0.01 to about 0.50 wt. %.

An embodiment of the present invention is schematically illustrated in FIGS. 1–4, wherein similar features bear similar reference numerals. Adverting to FIG. 1, interlayer dielectric 10, e.g., silicon oxide, is formed overlying a substrate (not shown). A plurality of openings 11 are formed in a designated area A in which a dense array of conductive lines are to be formed bordering open field B. A barrier layer 12, e.g., TaN, is deposited lining the openings 11 and on the upper surface of silicon oxide interlayer dielectric 10. Typically, the openings 11 are spaced apart by a distance C which is less than about 1 micron, e.g., about 0.2. Cu layer 13 is then deposited at thickness D of about 8,000 to about 18,000 Å.

Figure 2:
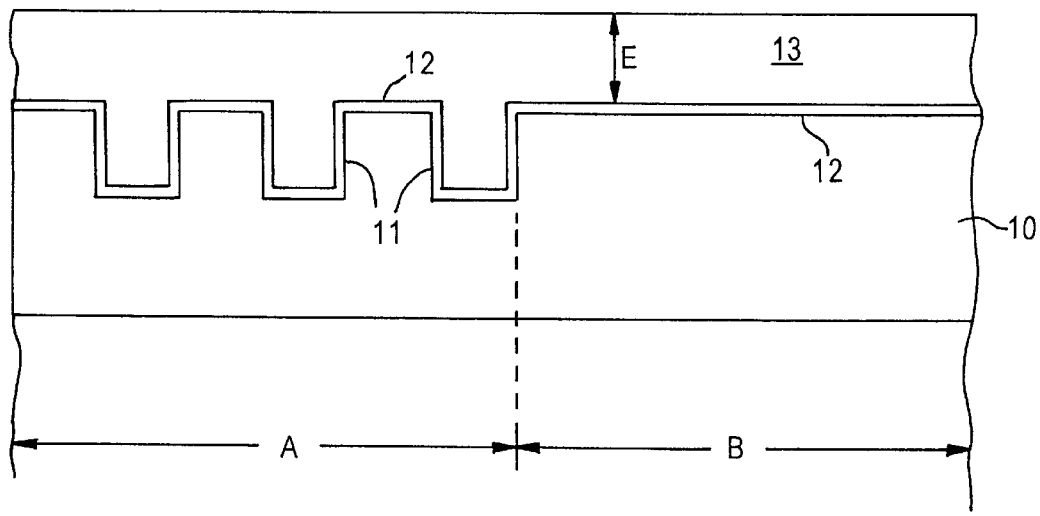
Figure 3:
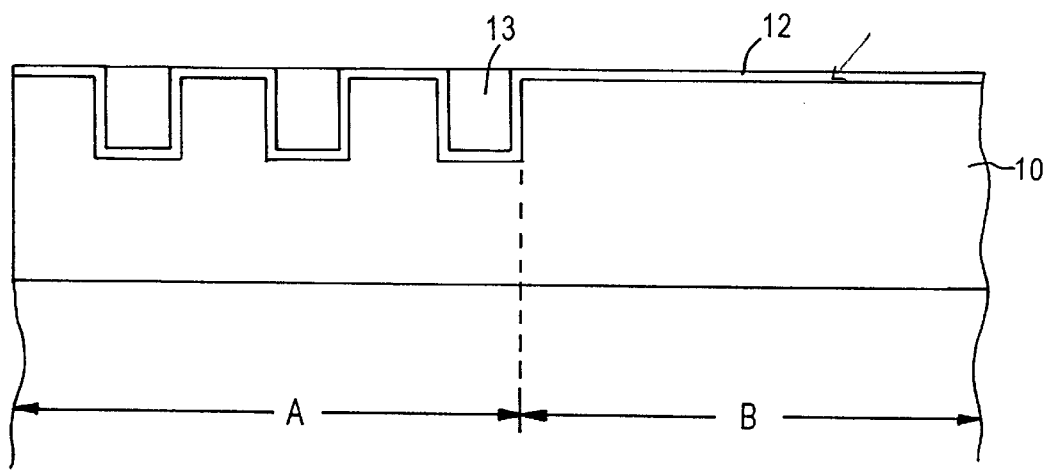

Adverting to FIG. 2, CMP is initially conducted to reduce the Cu layer 13 to a thickness E of about 500 Å to about 3,000 Å at a removal rate in excess of about 5,000 Å per minute. As shown in FIG. 3, CMP is then conducted with high selectivity to TaN barrier layer 12 stopping thereon.

Figure 4:
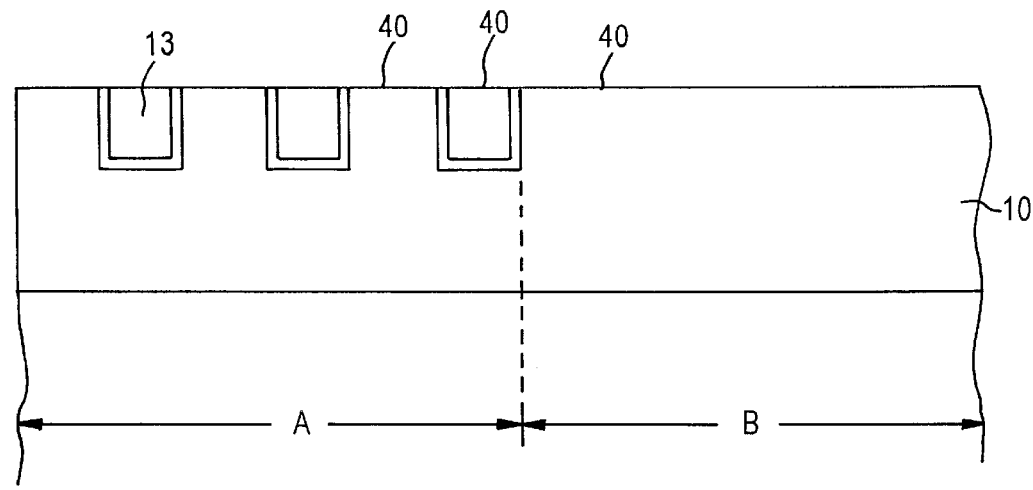

As shown in FIG. 4, buffing is conducted with zero or reversed selectivity with respect to Cu: TaN and Cu: silicon oxide to remove TaN layer 12 and buff the silicon oxide surface to remove or reduce scratching or defects, thereby completing planarization. The resulting Cu interconnection structure comprises a dense array A of Cu lines 13 bordered by open field B. The upper surface 40 exhibits a very high degree of uniform planarity with virtually no erosion or dishing.

In another embodiment in the present invention, the surface of the Cu or Cu alloy layer is cleaned to reduce defects. Thus, embodiments of the present invention comprise applying a cleaning solution, e.g., a solution containing a cleaning agent, to the wafer. It is been found particular effective to employ a solution comprising ammonium hydroxide, citric acid and deionized water.

The present invention is applicable to planarizing a wafer surface during various stages of semiconductor manufacturing. The present invention enjoys particular applicability in the manufacture of high density semiconductor devices with metal features in the deep submicron range.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of planarizing a wafer surface containing:

an interlayer dielectric having an upper surface and a plurality of spaced apart openings;

a barrier layer lining the opening and formed on the upper surface of the interlayer dielectric; and copper (Cu) or a copper alloy filling the openings and formed on the interlayer dielectric;

the method comprising:

chemical mechanical polishing (CMP) the wafer with an abrasive free chemical agent to selectively remove the copper or copper alloy layer and stopping on the barrier layer; and then buffing the wafer to remove the barrier layer at zero or reversed selectivity with respect to copper: barrier layer and copper: interlayer dielectric to form a dense array of copper or copper alloy features.

2. The method according to claim 1, wherein:

the interlayer dielectric comprises a silicon oxide;

the barrier layer comprises tantalum (Ta) or tantalum nitride (TaN); and buffing is conducted at zero or reversed selectivity with respect to copper: tantalum or tantalum nitride and copper: silicon oxide.

3. The method according to claim 2, wherein the wafer is buffed under conditions such that dishing within the dense array is no greater than about 100 Å.

4. The method according to claim 2, wherein selectively removing the copper or copper alloy layer comprises a selectivity of copper: tantalum or tantalum nitride of greater than 100.

5. The method according to claim 4, wherein the copper or copper alloy layer is selectively removed under conditions such that dishing in the dense array is not greater than about 300 Å.

6. The method according to claim 2, further comprising cleaning the copper or copper alloy surface after buffing.

7. The method according to claim 6, wherein cleaning the copper or copper alloy surface after buffing comprises applying a solution comprising a chelating agent.

8. The method according to claim 7, wherein the solution comprises ammonium hydroxide, citric acid, and deionized water.

9. The method according to claim 1, wherein the wafer is buffed on a rotating or linear polishing pad using an abrasive alkaline chemical agent.

10. The method according to claim 9, wherein the wafer is buffed with a chemical agent having a pH of about 8 to 11, containing:

about 1 to about 30 wt. % of abrasive particles;

up to about 0.10 wt. % of an inhibitor; and the remainder deionized water.

11. The method according to claim 10, wherein the chemical agent has a pH of about 9 to 10 and contains:

about 3 to about 6 wt. % of abrasive particles;

a non-chelating base;

about 0.01 to about 0.02 wt. % of an inhibitor; and the remainder deionized water.

12. The method according to claim 10, wherein the wafer is buffed at a pressure no greater than about 4 psi while rotating the polishing pad at about 40 to about 120 rpm.

13. The method according to claim 10, further comprising flowing an inhibitor on the wafer surface after completing CMP to remove the copper or copper alloy layer and prior to initiating buffing to prevent undue static etching.

14. The method according to claim 10, wherein a chelating agent is added to the chemical agent.

15. The method according to claim 14, wherein the chelating agent comprises glycine.

16. The method according to claim 15, wherein the chemical agent comprises about 0.01 to about 0.50 wt. % glycine.

* * * * *

UNITED STATES PATENT AND TRADEMARK OFFICE
CERTIFICATE OF CORRECTION

PATENT NO. : 6,656,842 B2
DATED : December 2, 2003
INVENTOR(S) : Li et al.

It is certified that error appears in the above-identified patent and that said Letters Patent is hereby corrected as shown below:

Column 2,
Line 4, please change "micride" to -- nitride --.

Column 4,
Line 2, please change "party" to -- part --.

Column 5,
Line 34, please change "derviced" to -- derived --.

Signed and Sealed this

Twenty-ninth Day of June, 2004

JON W. DUDAS
*Acting Director of the United States Patent and Trademark Office*